MANUFACTURING PROCESS FOR InSb THIN FILM SEMICONDUCTOR ELEMENT

Filed Feb. 25, 1969 2 Sheets-Sheet 1

INVENTORS
MASAHIDE OHSHITA
TSUNEHIRO TSUKAGOSHI

BY Sughrue, Rothwell, Mion, Zinn & Macpeak
ATTORNEYS

United States Patent Office
3,674,549
Patented July 4, 1972

3,674,549
MANUFACTURING PROCESS FOR AN InSb THIN FILM SEMICONDUCTOR ELEMENT

Masahide Ohshita, Kanagawa, and Tsunehiro Tsukagoshi, Saitama, Japan, assignors to Pioneer Electronic Corporation, Tokyo, Japan Filed Feb. 25, 1969, Ser. No. 802,079
Claims priority, application Japan, Feb. 28, 1968, 43/12,276; May 23, 1968, 43/34,316
Int. Cl. H01l 3/20, 7/32
U.S. Cl. 117—201 2 Claims

ABSTRACT OF THE DISCLOSURE

A process for producing a thin film semiconductor element of InSb having electron mobility and Hall coefficient values similar to bulk InSb is provided, wherein InSb and Sb are evaporated simultaneously from separate sources in a high vacuum to deposit a film, wherein InSb and Sb are evaporated simultaneously upon conjugating InSb and Sb on a single common vapor source in a high vacuum, or wherein InSb, produced by the zone melting method with a ratio of In to Sb of 1.5 to 2 in weight, is evaporated.

BACKGROUND OF THE INVENTION

(1) Field of the invention

This invention is directed to a manufacturing process for an InSb thin film semiconductor element having electron mobility and Hall coefficient values as close as possible to those of an InSb bulk element.

(2) Prior art

In order to produce the InSb thin film, various types of processes or methods such as a mechanical method, a deposition method, etc., have been utilized, but it was found to be practically impossible to obtain a thin film of thickness under 10$\mu$ by the mechanical method. Such a film may be produced by the evaporation method and, of the evaporation methods most frequently employed, the vacuum evaporation method, the three-temperature method and the flash evaporation method are considered most practical. However, no matter which of the above-mentioned methods is used, the quality of the InSb thin film obtained was of a degree where the electron mobility $\mu e$ and the Hall coefficient RH were 6,000–20,000 cm.$^2$/v. sec. and 100–200 cm.$^3$/coulomb, respectively. These values are much lower than those of ordinary InSb bulk element ($\mu e$=55,000–60,000 cm.$^2$/v. sec., RH=450–600 cm.$^3$/coulomb in the bulk element). According to the well known principle of the Hall effect of semiconductors, the Hall voltage VH has a linear relation to the flux density B of the magnetic field applied to the semiconductor element. Therefore, it is considered ideal to reproduce the sound from a magnetic recording tape by utilizing the Hall effect of a semiconductor element.

The Hall voltage VH is directly proportional to the Hall coefficient RH, provided that the thickness (d) of the Hall element, the given magnetic flux density B and the control current I are constant. Furthermore, the maximum efficiency of said Hall element is also proportional to the second power of the electron mobility of the element. Consequently, the mobility $\mu e$ and the Hall coefficient RH contribute significantly to the reproduction of sound from a magnetic recording tape when utilizing the Hall element. Hence, if the bulk element of semiconductor InSb having the above-mentioned values is utilized for a reproducing head, the sensitivity of said head is comparable to a formerly used coil-type magnetic reproducing or transducer head. However, from the results of experiments it is confirmed that unless a thin film has as a minimum, characteristics with $\mu e \geq 3{,}000$ cm.$^2$/v. sec. and RH$\geq$300 cm.$^3$/coulomb, said thin film may not be utilized as a substitute for the former coil-type magnetic transducer head when reproducing sound from a standard recording tape. Consequently, by utilizing a deposited InSb thin film element having deficient $\mu e$ and RH characteristics as obtained by prior art processes, a satisfactory result could not be obtained as a transducer head.

SUMMARY OF THE INVENTION

Therefore, the present invention is directed to a manufacturing process for growing an InSb thin film semiconductor element comprising maintaining a substrate at such a temperature that InSb may easily be deposited to grow on said substrate upon covalent-bonding of rich In deposited on said substrate and a large amount of Sb evaporated from a vapor source and either evaporating simultaneously both Sb and InSb, conjugated as a single common vapor source or as separate vapor sources, or evaporating InSb produced by the zone melting method wherein the In and Sb necessary to grow said deposited InSb thin film are weighed out so that the ratio of In to Sb may be between 1.5 and 2 in weight and then melted after being mixed with each other.

DETAILED DESCRIPTION OF THE INVENTION

Figure 1:
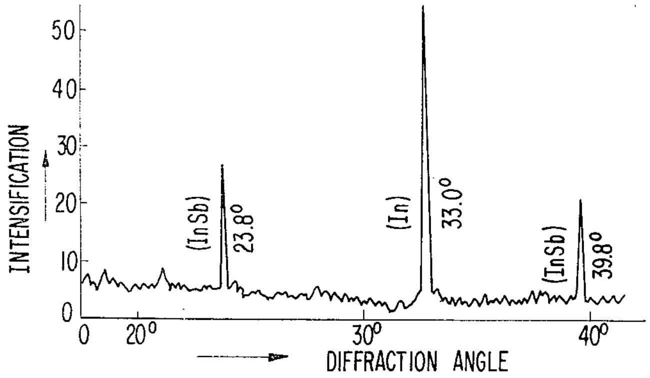
FIG. 1 is a graph showing the diffraction figures for a thin film semiconductor of InSb obtained by a prior art process.
Figure 2:
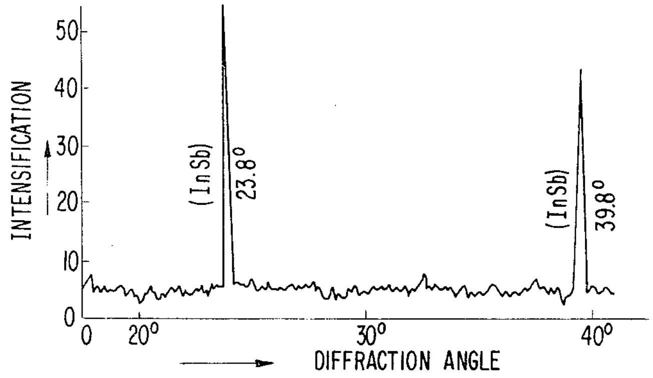
FIG. 2 is a graph showing the diffraction figures for a thin film semiconductor of InSb obtained according to the present invention.

An investigation was conducted with an X-ray diffraction meter of some grown thin film which was obtained by an ordinary evaporation method, that is, a film which was deposited on a substrate having a temperature of 340° C. for about twenty minutes by heating the InSb bulk element under high vacuum conditions ($5\times10^{-6}$–$5\times10^{-5}$ torr). According to this experiment it was found that a large quantity of In in addition to InSb was deposited in said grown thin film as shown in FIG. 1. As this fact had already been known, it is believed that the moment the evaporated Sb is deposited on the substrate, said Sb is again re-evaporated. Therefore, it was expected that under certain proper conditions if a reasonable amount of Sb in excess of the previous method was supplied on the substrate in the evaporating operation, the thin film grown on the substrate would not contain a large amount of In in its composition but contain more single crystal InSb as a whole, whereby the mobility and Hall coefficient of said thin film might have higher values, that is much closer to those of the bulk element as compared to the thin film obtained by the former method. Thus, a large number of experiments were carried out by changing various conditions of the manufacturing process in the growing of thin films. For instance, through temperature-programming of the vapor sources of both In and Sb and their substrate in the so-called three-temperature method, said respective temperatures were controlled so that the quantity of Sb on said substrate might be increased, but it was still impossible to obtain a grown thin film having the desired values of RH and $\mu e$. Other experiments were carried out to investigate the composition of the grown thin film through X-rays. From these results, it was determined that the substrate temperature should be suitable so that the intermetallic compound might be grown by binding the deposited In and Sb on said substrate at said temperature. Thus, the following process was adapted wherein the substrate temperature was selected so that In and Sb might form a covalent bond, while the quantity of Sb and InSb were also selected in a reasonable ratio so that Sb might be deposited on said substrate and then said Sb and InSb would be simultaneously evaporated either from separate sources or from a single common vapor source in a conjugated condition. From this procedure, a suitable and practical method for growing an InSb thin film has been developed.

Figure 3:
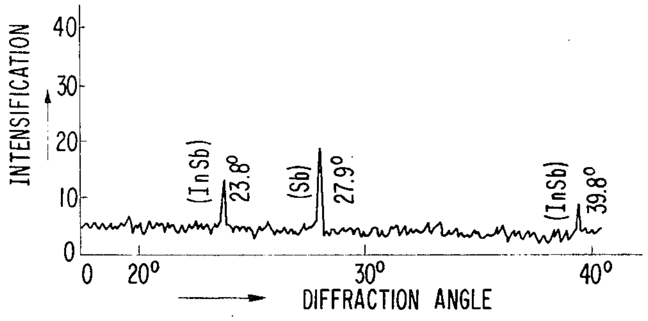
FIG. 3 is a graph showing the diffraction figures for a thin film semiconductor of InSb obtained by prior art process.
Figure 4:
FIG. 4 is an enlarged microphotograph showing a portion of the grown thin film obtained by the process of the present invention.

As an embodiment according to the present invention, a manufacturing process for growing an InSb thin film which is deposited upon evaporating InSb and Sb under their conjugated condition will be described below. FIG. 3 is a graph showing the diffraction figures for a prior art thin film which is obtained by depositing the InSb bulk element for the first five minutes with the substrate being maintained at a temperature of 330° C.–350° C. under high vacuum ($10^{-6}$ torr). Here the existence of Sb is observed. But, as shown in FIG. 1, under the same conditions above-mentioned, when said bulk element is evaporated for more than twenty minutes initially, the co-existence of InSb and In is recognized in the composition of said grown thin film and no Sb is present. This fact indicates that first a large amount of Sb is evaporated from said vapor source and then gradually a large amount of In is evaporated. Furthermore, said Sb on said substrate is re-evaporated. This phenomenon is acceptable since the vapor pressure of Sb ($10\times10^{-4}$ torr) is higher than that of In ($8\times10^{-10}$ torr). Therefore, InSb (melting point 523° C.) and Sb (melting point 630.5° C.) are conjugated as a single vapor source in a boat such as a thin heating plate of Mo metal and then said vapor source is heated at a reasonable temperature so that said InSb and Sb are melted together at the same time. Under this condition, InSb is first melted and then Sb is melted and both begin evaporating at the instant they are in a unitary melted condition.

The composition of the thin film which is grown upon deposition of InSb only, is as follows. With the condition that the substrate of mica or glass on which the depositing operation is performed is maintained at some temperature between 330° C.–340° C., it is observed that for the first five minutes of deposition Sb is deposited as shown in FIG. 3, but when about twenty minutes of said deposition has elapsed InSb is grown and a large quantity of In is deposited as shown in FIG. 1. From the results, it is also observed that the earlier deposited Sb has been re-evaporated from the substrate and then dissipated out, and that the quantity of Sb supplied for evaporation is insufficient. Therefore, in order to convert the In deposited in large quantities into InSb as much as possible, during the depositing operation, it is necessary to evaporate a great quantity of Sb compared to the former method and maintain the substrate temperature higher than in the former method to facilitate the binding of Sb and In. With these conditions it is natural to expect a further increase of the re-evaporation of Sb but it is also believed that the re-binding of Sb and In which are simultaneously deposited on said substrate is conducted easily and at the same time the growth of single-crystal InSb is accelerated.

The following table shows the values of the Hall coefficient and the electron mobility of grown thin films, deposited at various temperatures.

| Test No. | Substrate temp., ° C. | Electron mobility ($\mu e$), cm $^2$/v. sec. | Hall coefficient (RH), cm.$^3$/coulomb | Evaporation condition of InSb and Sb |
|---|---|---|---|---|
| 1 | 330–340 | 5,000–10,000 | 30–100 | InSb only. |
| 2 | 380–390 | 10,000–22,000 | 100–130 | Do. |
| 3 | 400–450 | 25,000–40,000 | 250–380 | InSb and Sb separately, but simultaneously. |
| 4 | 420–450 | 30,000–40,000 | 300–400 | InSb and Sb conjugated and simultaneously. |

In Test No. 3, InSb and Sb were evaporated simultaneously from separate sources but it was difficult to obtain a satisfactory yield as the depositing operation was considerably difficult to control.

In Test No. 4, InSb and Sb were conjugated and evaporated simultaneously as a single common vapour source and in this case the yield was extremely satisfactory and also the operation was easily controlled in comparison to Test No. 3. Furthermore, there is shown an enlarged microphotograph of an example of the grown thin film obtained by Test No. 4. The grown thin films of Tests No. 3 and 4 have electron mobilities and Hall coefficients as might be expected as shown in the table. In Test No. 4 the evaporation operation is started at the point when InSb and Sb are completely melted and united. First Sb is gradually deposited and as the termination of said operation approaches, In is deposited in large quantities. Therefore, it is desirable to prevent In from being further deposited by controlling a shutter at a time somewhat near the termination of said operation so as not to cause an excess evaporation of In.

Thus, the grown thin film here obtained is of a thickness of under 1$\mu$ which was quite impossible to obtain by former mechanical methods and also has special qualities which could be applied to practical use. Therefore, the production of a semi-conductive film element of InSb having excellent qualities which were impossible to obtain, according to former methods, has now been made possible. That is to say, values substantially three or four times the electron mobility and more than twice the Hall effect were obtained as compared to the former values. In these experiments or tests, InSb and Sb having comparatively low purities were used but by applying the principles of the present invention, it will be possible to provide a more effective production.

As the above-mentioned heating and evaporating process on the Mo thin plate is repeated, the initial degree of purity of the elements on the boat fails. Therefore, the conjugated InSb and Sb are apt to be in independently melted condition and not in the desired unitary condition. Thus, it becomes difficult to control the evaporating conditions and it is also impossible to increase the yield of the InSb grown film by this manufacturing process.

In a modified process suitable for mass production, InSb with a suitable amount of Sb for producing the desired grown InSb thin film, is previously produced by the so-called zone melting method and then the necessary quantity for each operation is weighed out and placed upon the vapor source boat of Mo and evaporated to grow a thin film.

In the growing process of the InSb deposited thin film as above described, InSb and sufficient Sb for changing most of the In into InSb are previously refined by the zone melting method thereby removing the impurities as much as possible and then the desired amount is weighed out at each operation and evaporated on the vapor source. Thus, by adhering to a relatively small number of necessary specified conditions, the mass-production of the thin film elements having constant qualities can be achieved.

Some embodiments of InSb thin film according to the above-mentioned zone melting method will be described.

Components of In and Sb which are produced by a generally mechanical refining process each have a purity of about 99.9999%. But when an InSb deposited thin film, which contains as high a purity as possible is employed, said thin film may have a higher electron mobility and a larger Hall coefficient as desired. Therefore, In and Sb are refined some ten times by the zone melting method to attain a higher order of purity. Previously, it was easy to obtain, on the ordinary market, InSb which was refined by mix-melting said pre-refined In and Sb products by zone melting, but the high quality deposited thin film of InSb could not be obtained by using such a standard product. Accordingly, In and Sb are weighed out so that the ratio of In to Sb may be between 1.5 and 2.0 in weight, melted after mixing and refined by the zone melting method at least ten times. The thus refined flat plate of InSb is then broken into small pieces and may be weighed out for any desired operation. Therefore, it is effective to repeatedly use the same thin plate vapor source for heating and evaporating and it is also possible to mass produce the desired deposited thin film with constant quality.

What is claimed is:

1. A process for growing an indium antimonide thin film seimconductor element in an evaporating chamber, comprising (a) maintaining a substrate in a predetermined temperature range so that a film of covalently bonded indium antimonide (InSb) is formed thereon, (b) evaporating indium antimonide (InSb) and antimony (Sb) together simultaneously from single common vapor source, and (c) keeping said evaporating chamber at a high vacuum in which said substrate and said vapor source are set.

2. A process as set forth in claim 1 wherein said predetermined temperature range is 420–450° C.

References Cited

UNITED STATES PATENTS

| | | | |
|---|---|---|---|
| 2,759,861 | 8/1956 | Collins | 117—106 X |
| 2,938,816 | 5/1960 | Günther | 117—201 |
| 2,994,621 | 8/1961 | Hugle et al. | 117—201 |
| 3,082,124 | 3/1963 | French et al. | 117—106 X |

FOREIGN PATENTS

| | | | |
|---|---|---|---|
| 929,865 | 6/1963 | England | 117—106 |

WILLIAM L. JARVIS, Primary Examiner

U.S. Cl. X.R.

117—106 A; 252—62.3 GA